United States Patent [19]

Hara et al.

[11] Patent Number: 4,794,611

[45] Date of Patent: Dec. 27, 1988

[54] SEMICONDUCTOR LASER HAVING SUPERLATTICE STRUCTURE

[75] Inventors: Toshitami Hara, Tokyo; Yoshinobu Sekiguchi; Seiichi Miyazawa, both of Kawasaki; Hidetoshi Nojiri, Matsudo; Akira Shimizu, Tokyo; Isao Hakamada, Yokohama, all of Japan

[73] Assignee: Canon Kabushiki Kaisha, Tokyo, Japan

[21] Appl. No.: 809,770

[22] Filed: Dec. 17, 1985

[30] Foreign Application Priority Data

Dec. 18, 1984 [JP] Japan .................. 59-265375

[51] Int. Cl.$^4$ .............................. H01S 3/19
[52] U.S. Cl. ........................... 372/45; 357/4; 357/17
[58] Field of Search ............... 372/44, 45, 46; 357/17, 357/90, 45 L

[56] References Cited

U.S. PATENT DOCUMENTS

| 3,978,426 | 8/1976 | Logan et al. ...................... 372/45 |
| 4,317,086 | 2/1982 | Scifres et al. ..................... 372/49 |
| 4,573,161 | 2/1986 | Sakai et al. ....................... 372/45 |

FOREIGN PATENT DOCUMENTS

| A031808 | 7/1981 | European Pat. Off. . |
| A081956 | 6/1983 | European Pat. Off. . |
| 2131610 | 6/1984 | United Kingdom . |

OTHER PUBLICATIONS

JP-A-54 45 090 (24-04-1981) Patent Abstracts of Japan, vol. 5, No. 103 (E-64) [775], Jul. 3, 1981.
Burnham, et al., "Prevention of Optical Facet Damage in Semiconductor Lasers," Xerox Disclosure Journal, vol. 4, No. 5, 9-10/79, p. 637.

Primary Examiner—William L. Sikes
Assistant Examiner—Georgia Y. Epps
Attorney, Agent, or Firm—Fitzpatrick, Cella, Harper & Scinto

[57] ABSTRACT

There is disclosed a semiconductor laser having a super lattice structure near an active layer, in which the super lattice structure consists of at least two types of materials which have different bandgaps, the materials are regularly and alternately arranged, and thickness of adjacent layers of the materials change such that a ratio of the thicknesses changes within the super lattice structure toward an active layer.

4 Claims, 2 Drawing Sheets

SEMICONDUCTOR LASER HAVING SUPERLATTICE STRUCTURE

BACKGROUND OF THE INVENTION

1. Field of the Invention

The present invention relates to a semiconductor laser and, more particularly, to a semiconductor laser having a super lattice structure near an active layer.

2. Description of the Prior Art

A well-known conventional semiconductor laser using a super lattice of this type has a conduction band having an MQW (Multi-Quantum-Well) structure. FIG. 1 shows a conduction band (CB) typically used in such a semiconductor laser. The constituting materials have three bandgaps. Materials 31, 32 and 33 have bandgaps having sizes which increase in the order of 31, 32 and 33. The material 31 having a largest bandgap in GaAs-$Al_xGa_{1-x}As$ systems is, e.g., $Al_xGa_{1-x}As$ (e.g., x=0.4) having a large value of X. The material 31 is called a wide gap material with respect to the material 33 (consisting of GaAs) having a minimum bandgap. The material 32 consists of $Al_xGa_{1-x}As$ (x≈0.2), and is a wide gap material with respect to the material 33.

A layer 34 is an active/optical confinement layer. In the layer 34, a material (the material 32 in FIG. 1) having a wider bandgap is called a "wide gap material", and a material (the material 33 in FIG. 1) having a narrower bandgap is called a "narrow gap material". The thickness of the two materials are represented by LB and LW, respectively. In the MQW structure, LB is normally about 20 to 40 Å, and LW is selected to be 30 to 150 Å. A semiconductor layer having such a structure is known to oscillate at a low threshold current.

FIG. 2 shows a conduction band (CB) of a semiconductor laser having a similar super lattice structure called GRIN-SCH (Graded-Index Waveguide and Separate Carrier and Optical Confinement Heterostructure) structure. Materials 41 and 43 respectively have the same compositions as the materials 31 and 32 in FIG. 1. When a GaAs.AlGaAs system is used, the material 42 has a composition such that x in $Al_xGa_{1-x}As$ gradually decreases toward the material or active layer 43. Electrons and holes are recombined mainly in the active layer 43 and emit light. The light emitted by electron-hole recombination is confined in the region of the material 42 mainly by the diffraction effect. Therefore, the structure shown in FIG. 2 is considered to have an oscillation threshold current lower than that of the MQW structure. The structure in FIG. 2 has an active/optical confinement layer 44.

In the above-described conventional semiconductor layer (GRIN-SCH structure, the composition in the optical confinement layer (material 42) must be gradually changed. In order to achieve this, the crucible temperature of a deposition source must be increased/decreased within a short period of time. Temperature control for this has been difficult to actually perform.

SUMMARY OF THE INVENTION

It is an object of the present invention to provide a semiconductor layer wherein an effect equivalent to that obtained with a GRIN-SCH structure can be obtained by controlling only film thickness with a super lattice structure, and variations in film quality are reduced by digitally controlling the film composition, so that yield is improved.

In order to achieve the above object of the present invention, an optical confinement layer in a super lattice structure region is formed such that a wide gap material (thickness LB) and narrow gap material (thickness LW) are alternately stacked, and the value of thickness LB is gradually decreased within the entire region toward an active layer, that is, the value of (LB/LW) gradually decreases toward the active layer.

According to a semiconductor laser having a super lattice structure region with an active layer, the ratio (LB/LW) of the thicknesses of the adjacent wide and narrow gap materials of the super lattice structure region decreases within the entire region toward the active layer.

DETAILED DESCRIPTION OF THE PREFERRED EMBODIMENT

The preferred embodiment of the present invention will be described with reference to the accompanying drawings.

Figure 4:
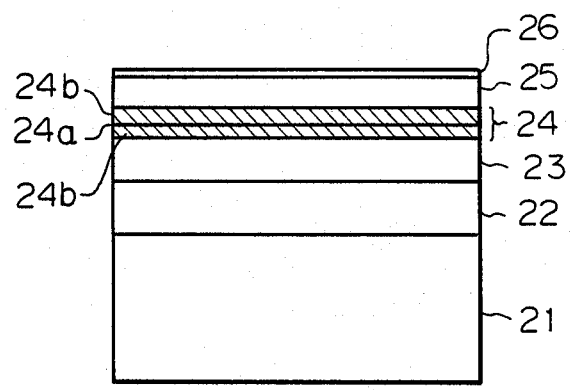
FIG. 4 shows a basic structure of the semiconductor layer shown in FIG. 1.

FIG. 4 shows the basic structure of a semiconductor layer according to the present invention. Although the present invention will be described with reference to a semiconductor layer using GaAs.AlGaAs, the present invention is similarly applicable to other semiconductor lasers using other materials such as InGaAsP.Inp.

An n-type (Si-Doped) GaAs layer 22 is grown on an n-type GaAs substrate 21 by the molecular beam epitaxy method. After growing an n-type $Al_xGa_{1-x}As$ layer 23 to a thickness of 2 μm (x=0.4), a GaAs layer (thickness LW) 24a and $Al_{0.4}Ga_{0.6}As$ layer (thickness LB) 24b are alternately grown by the molecular beam epitaxy method to form an active/optical confinement layer 24. Al, Ga, and As deposition sources are arranged in the molecular beam epitaxy apparatus, and the two types of semiconductor layers are formed by opening/closing a shutter arranged at the Al deposition source. The thickness of the two semiconductor layers are controlled by changing the open/close times of the shutter. Doping in the layer 24b (60 Å) is not excuted.

The layer 24a is an active layer and the layer 24b is an optical confinement layer. Subsequently, a p-type (Be-doped) $Al_xGa_{1-x}As$ layer 25 (x=0.4; 2 μm thick) and a p-type GaAs layer 26 (0.1 μm thick are formed.

Figure 3:
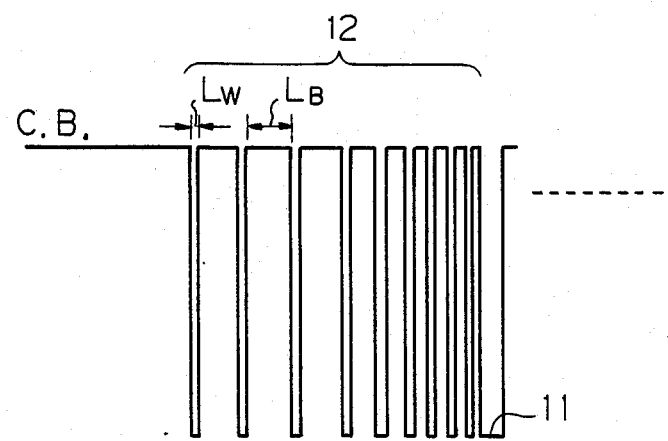
FIG. 3 shows a multilayer structure as a characteristic feature of a semiconductor laser according to the present invention.

FIG. 3 shows a stacked state of the super lattice structure, i.e., an active layer 11 and an optical confinement layer 12. The active layer 11 and the optical confinement layer 12 correspond to the layers 24a and 24b in FIG. 4. LB and LW are thickness of the wide and narrow gap materials, as has been described above.

Table 1 shows the stacking procedures from "1" to "168" for the active/optical confinement layer 24. Procedures "166" to "329" are reverse procedures to the procedures "1" to "164". LW is preferably 20 Å or less so that injected electrons will not be trapped, and is more preferably 10 Å or less. In this embodiment, LW is constant (5 Å). However, LW need not be constant and can vary among 7, 6 and 3 Å, etc.

The requirement for the semiconductor laser of the present invention is as follows. The optical confinement layer 12 is formed so that the ratio (LB/LW) of the thicknesses LB and LW of the adjacent wide and narrow gap materials in the super lattice structure is gradually decreased toward the center (active layer 11).

In this embodiment, as shown in Table 1, 164 sets of layers (one set is LB+LW) sandwich the active layer 11 (LW=60 Å of "165"). However, the effect of the present invention can be obtained with only about 40 such sets.

Figure 1:
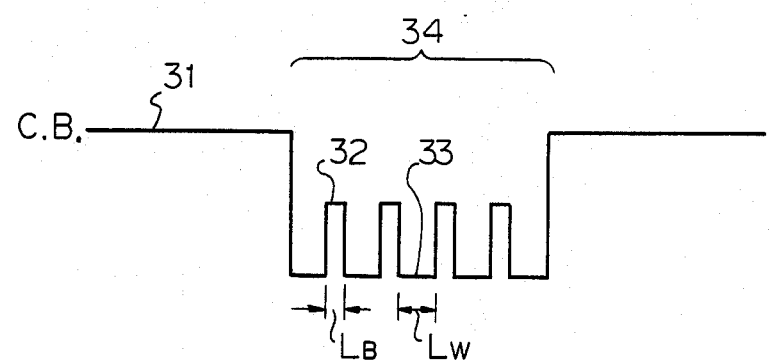
FIGS. 1 and 2 show conduction bands of semiconductor lasers having conventional super lattice structures, i.e., the MQW and GRIN-SCH structures.
Figure 2:
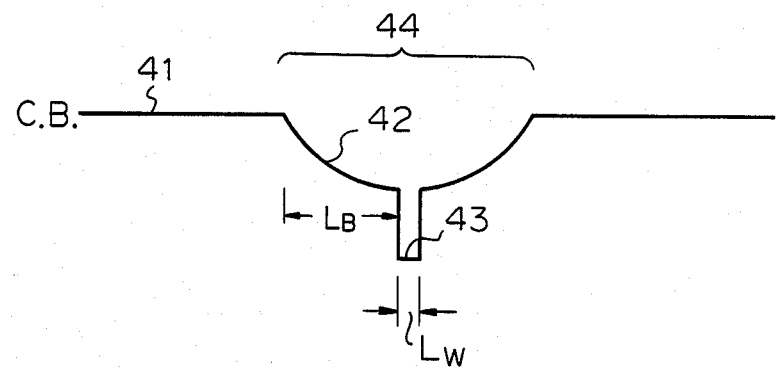

With the laser of this embodiment, an Au-Ge electrode was deposited on the side of the n-type GaAs substrate 21 and a Cr-Au electrode was deposited on the side of the p-type GaAs layer 26 to prepare a broad area laser having a size of 400×300 μm. When the oscillation threshold current density jth was measured, an excellent value of 250 A/cm² was obtained. This value is equivalent to the value of jth when the Al composition was set by precise temperature control to achieve a potential distribution as shown in FIG. 2. This means that the laser of the embodiment has levels of potentials of electrons and holes and the optical confinement effect which are equivalent to the GRIN-SCH structure shown in FIG. 2.

As described above, according to the present invention, the periods of the two types of materials (wide and narrow gap materials) in a super lattice structure region are gradually changed to allow easy control. Although control is easy, the prepared film can have uniform quality to improve manufacturing yield, and laser oscillation at a low threshold current density can be performed. Table 1 shows the stacking procedures of the super lattice structure according to the present invention.

In the above embodiment, two types of materials are used to obtain a film of uniform quality and continuous bandgaps. However, the same effect can be obtained with three or more materials.

TABLE 1

|  | $L_B$ (Å) | $L_W$ (Å) |
|---|---|---|
| 1" |  | 5 |
| 2" | 50 |  |
| 3" |  | 5 |
| 4" | 48 |  |
| 5" |  | 5 |
| 6" | 46 |  |
| 7" |  | 5 |
| 8" | 44 |  |
| 9" |  | 5 |
| 10" | 42 |  |
| 11" |  | 5 |
| 12" | 40 |  |
| 13" |  | 5 |
| 14" | 38 |  |
| 15" |  | 5 |
| 16" | 36 |  |
| 17" |  | 5 |
| 18" | 34 |  |
| 19" |  | 5 |
| 20" | 32 |  |
| 21" |  | 5 |
| 22" | 30 |  |
| 23" |  | 5 |
| 24" | 28 |  |
| 25" |  | 5 |
| 26" | 26 |  |
| 27" |  | 5 |
| 28" | 25 |  |
| 29" |  | 5 |
| 30" | 24 |  |
| 31" |  | 5 |
| 32" | 23 |  |
| 33" |  | 5 |
| 34" | 22 |  |
| 35" |  | 5 |
| 36" | 21 |  |
| 37" |  | 5 |
| 38" | 20 |  |
| 39" |  | 5 |
| 40" | 19 |  |
| 41" |  | 5 |
| 42" | 18 |  |
| 43" |  | 5 |
| 44" | 17 |  |
| 45" |  | 5 |
| 46" | 16 |  |
| 47" |  | 5 |
| 48" | 15 |  |
| 49" |  | 5 |
| 50" | 14 |  |
| 51" |  | 5 |
| 52" | 13.5 |  |
| 53" |  | 5 |
| 54" | 13 |  |
| 55" |  | 5 |
| 56" | 12.5 |  |
| 57" |  | 5 |
| 58" | 12 |  |
| 59" |  | 5 |
| 60" | 11.75 |  |
| 61" |  | 5 |
| 62" | 11.5 |  |
| 63" |  | 5 |
| 64" | 11.25 |  |
| 65" |  | 5 |
| 66" | 11 |  |
| 67" |  | 5 |
| 68" | 10.75 |  |
| 69" |  | 5 |
| 70" | 10.5 |  |
| 71" |  | 5 |
| 72" | 10.25 |  |
| 73" |  | 5 |
| 74" | 10 |  |
| 75" |  | 5 |
| 76" | 9.8 |  |
| 77" |  | 5 |
| 78" | 9.6 |  |
| 79" |  | 5 |
| 80" | 9.4 |  |
| 81" |  | 5 |
| 82" | 9.2 |  |
| 83" |  | 5 |
| 84" | 9.0 |  |
| 85" |  | 5 |
| 86" | 8.8 |  |
| 87" |  | 5 |
| 88" | 8.6 |  |
| 89" |  | 5 |
| 90" | 8.4 |  |
| 91" |  | 5 |
| 92" | 8.2 |  |
| 93" |  | 5 |
| 94" | 8.1 |  |
| 95" |  | 5 |
| 96" | 8.0 |  |
| 97" |  | 5 |
| 98" | 7.9 |  |
| 99" |  | 5 |
| 100" | 7.8 |  |
| 101" |  | 5 |
| 102" | 7.7 |  |
| 103" |  | 5 |
| 104" | 7.6 |  |
| 105" |  | 5 |
| 106" | 7.5 |  |
| 107" |  | 5 |
| 108" | 7.4 |  |
| 109" |  | 5 |
| 110" | 7.3 |  |
| 111" |  | 5 |
| 112" | 7.2 |  |
| 113" |  | 5 |

TABLE 1-continued

| | $L_B$ (Å) | $L_W$ (Å) |
|---|---|---|
| 114″ | 7.1 | |
| 115″ | | 5 |
| 116″ | 7.0 | |
| 117″ | | 5 |
| 118″ | 7.0 | |
| 119″ | | 5 |
| 120″ | 6.8 | |
| 121″ | | 5 |
| 122″ | 6.8 | |
| 123″ | | 5 |
| 124″ | 6.6 | |
| 125″ | | 5 |
| 126″ | 6.6 | |
| 127″ | | 5 |
| 128″ | 6.4 | |
| 129″ | | 5 |
| 130″ | 6.4 | |
| 131″ | | 5 |
| 132″ | 6.2 | |
| 133″ | | 5 |
| 134″ | 6.2 | |
| 135″ | | 5 |
| 136″ | 6.0 | |
| 137″ | | 5 |
| 138″ | 6.0 | |
| 139″ | | 5 |
| 140″ | 5.8 | |
| 141″ | | 5 |
| 142″ | 5.8 | |
| 143″ | | 5 |
| 144″ | 5.6 | |
| 145″ | | 5 |
| 146″ | 5.6 | |
| 147″ | | 5 |
| 148″ | 5.4 | |
| 149″ | | 5 |
| 150″ | 5.4 | |
| 151″ | | 5 |
| 152″ | 5.4 | |
| 153″ | | 5 |
| 154″ | 5.2 | |
| 155″ | | 5 |
| 156″ | 5.2 | |
| 157″ | | 5 |
| 158″ | 5.2 | |

TABLE 1-continued

| | $L_B$ (Å) | $L_W$ (Å) |
|---|---|---|
| 159″ | | 5 |
| 160″ | 5.0 | |
| 161″ | | 5 |
| 162″ | 5.0 | |
| 163″ | | 5 |
| 164″ | 5.0 | |
| 165″ | | 60 |
| 166″ | 5.0 | |
| 167″ | | 5 |
| 168″ | 5.0 | |
| ⋮ | ⋮ | ⋮ |
| 327″ | | 5 |
| 328″ | 50 | |
| 329″ | | 5 |

We claim:

1. A semiconductor laser having a superlattice structure region adjacent to an active layer, wherein the improvement comprises a super-lattice structure including a plurality of regularly alternating first layers and second layers, said first layers consisting of a material having a first bandgap and said second layers consisting of a material having a second bandgap; said first bandgap being larger than said second bandgap; wherein the first layers and second layers have thicknesses such that between adjacent pairs of said first layers and said second layers, the ratio of the thickness of the first layer of said pairs to the thickness of the second layer of said pairs decreases in the direction towards the active layer; and the thickness of the first layers decreases in the direction towards the active layer.

2. A semiconductor laser according to claim 1, wherein a thickness of the second layer is constant.

3. A semiconductor laser according to claim 1, wherein the material having a second bandgap is GaAs and the material having a first bandgap is $Al_xGa_{1-x}As$ ($x \neq 0$).

4. A semiconductor laser according to claim 1 wherein the thickness of the second layer is 20 Å or less.

* * * * *